(12) United States Patent
Jacobsen et al.

(10) Patent No.: US 6,620,402 B2
(45) Date of Patent: Sep. 16, 2003

(54) METHOD OF PREPARING ZEOLITE SINGLE CRYSTALS WITH STRAIGHT MESOPORES

(75) Inventors: Claus J. H. Jacobsen, Jaegerspris (DK); Iver Schmidt, Kobenhavn O (DK); Søren Dahl, Hillerod (DK); Konrad Herbst, Soborg (DK); Søren Pehrson, Vanlose (DK)

(73) Assignee: Haldor Topsoe A.S, Lyngby (DK)

( * ) Notice: Subject to any disclaimer, the term of this patent is extended or adjusted under 35 U.S.C. 154(b) by 196 days.

(21) Appl. No.: 09/899,245

(22) Filed: Jul. 6, 2001

(65) Prior Publication Data

US 2002/0034471 A1 Mar. 21, 2002

Related U.S. Application Data

(63) Continuation-in-part of application No. 09/730,462, filed on Dec. 5, 2000, now Pat. No. 6,565,826.

(30) Foreign Application Priority Data

Dec. 6, 1999 (DK) .......................... 1999 01745

(51) Int. Cl.[7] .................. C01B 39/04; C01B 39/36
(52) U.S. Cl. .................. 423/716; 423/705; 423/707; 423/DIG. 22; 423/DIG. 27; 502/60; 502/63; 502/64
(58) Field of Search .................. 423/700, 705, 423/707, 716, DIG. 22, DIG. 27, 713, 326; 502/60, 63, 64

(56) References Cited

U.S. PATENT DOCUMENTS

| | | | | |
|---|---|---|---|---|
| 4,508,841 A | * | 4/1985 | Onuma et al. | 502/73 |
| 5,723,397 A | * | 3/1998 | Verduijn | 502/4 |
| 5,849,258 A | * | 12/1998 | Lujano et al. | 423/700 |
| 6,241,960 B1 | * | 6/2001 | Tops.o slashed.e et al. | 423/700 |
| 2001/0031241 A1 | * | 10/2001 | Lacombe et al. | 423/705 |
| 2002/0192155 A1 | * | 12/2002 | Sterte et al. | 423/700 |

FOREIGN PATENT DOCUMENTS

| | | | | |
|---|---|---|---|---|
| EP | 1002764 A | * | 5/2000 | |
| WO | WO-9529751 A | * | 11/1995 | |
| WO | WO-9747381 A | * | 12/1997 | |
| WO | WO-200000287 A | * | 1/2000 | |

OTHER PUBLICATIONS

Jacobsen et al., "Mesoporous Zeolite Single Crystals," J. Am. Chem. Soc., vol. 122, pp. 7116–7117, Jul. 2000.*
Madsen et al., "Nanosized zeolite crystals–convenient control of crystal size distribution by confined space synthesis," Chem. Commun., pp. 673–674, 1999.*
Holland et al., "Dual Templating of Macroporous Silicates with Zeolitic Frameworks," J. Am. Chem. Soc., vol. 121, pp. 4308–4309, Apr. 1999.*

* cited by examiner

*Primary Examiner*—David Sample
(74) *Attorney, Agent, or Firm*—Dickstein Shapiro Morin & Oshinsky, LLP

(57) ABSTRACT

Method of preparing zeolite single crystals with straight mesopores by applying a synthesis gel with zeolite precursor composition within the pore system and on the surface of a particulate matrix material template of carbon comprising the steps of:

providing a templating material with a diameter of 2 to 50 nanometers and a length-to-diameter aspect ratio of at least 5,
  applying the zeolite precursor to the surface of the templating material using sequential impregnation,
  subjecting the precursor composition to crystallising conditions, and
  isolating porous single zeolite crystals with straight mesopores by removing the matrix template material.

7 Claims, 3 Drawing Sheets

TEM of carbon nanotube templated mesoporous silicalite-1 after calcination.

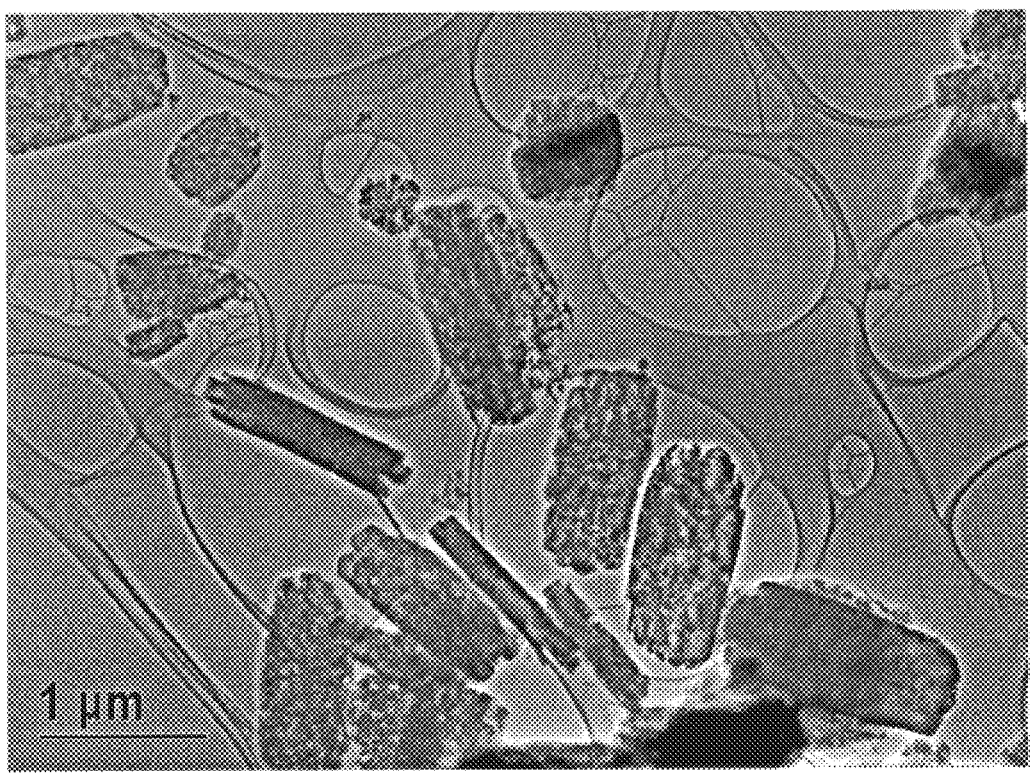
Fig. 1. TEM of mesoporous zeolite with tortuous pores.

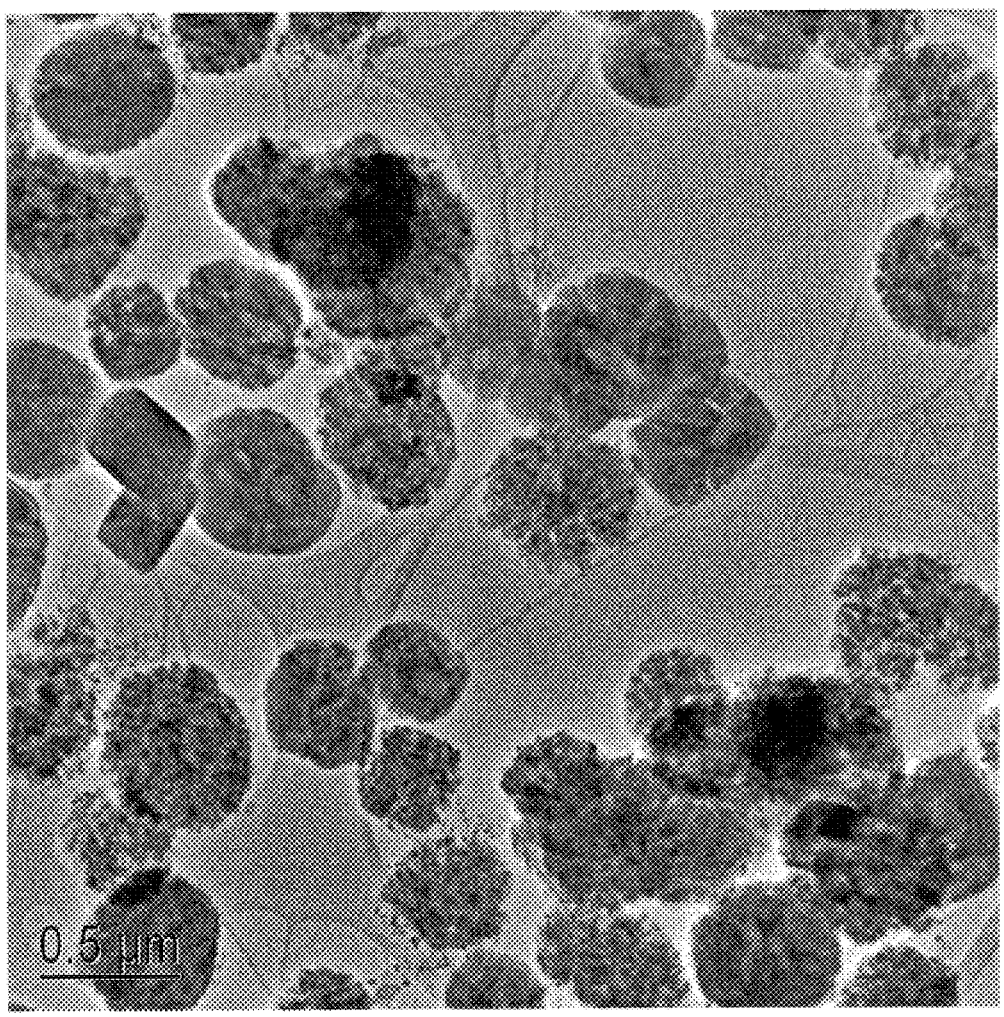
Fig. 2. TEM of carbon nanotube templated mesoporous silicalite-1 after calcination.

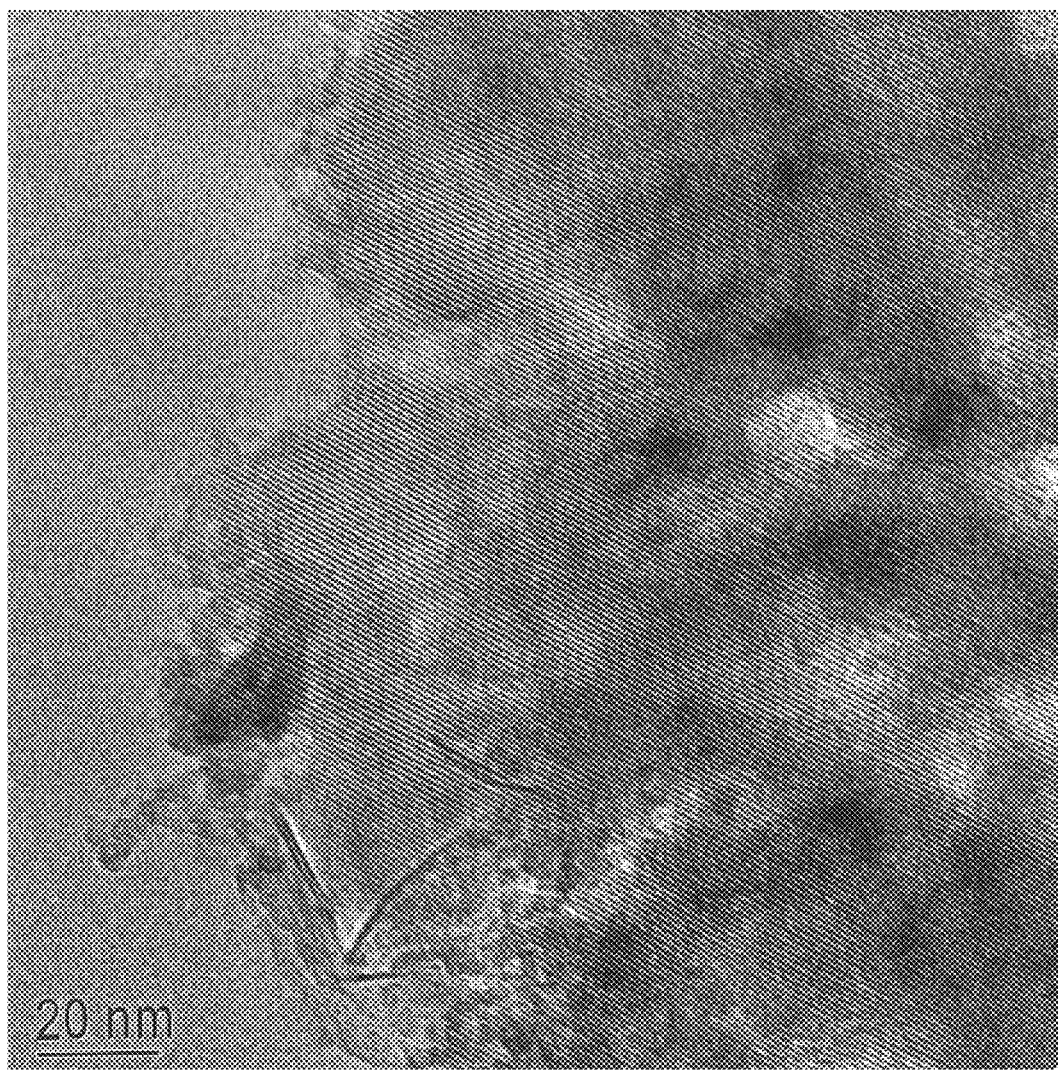
Figure 3. TEM of carbon nanotube templated mesoporous silicalite-1 after calcination.

METHOD OF PREPARING ZEOLITE SINGLE CRYSTALS WITH STRAIGHT MESOPORES

This application is a continuation-in-part of U.S. application Ser. No. 09/730,462, filed Dec. 5, 2000, now U.S. Pat. No. 6,565,826.

The present invention relates to a method of preparing zeolite crystals with a pore system of straight mesopores. Zeolites find widespread use as heterogeneous catalysts. In many applications it is a problem that zeolites only have micropores, since this imposes diffusion limitations on the reaction rate. Several attempts to provide zeolitic crystals with a mesoporous system have been made in the past. One possibility is to lower the crystal size of the zeolite (Madsen C. Jacobsen, C. J. H., Chem.Comm. (1999) (673)) and another possibility is to use mesoporous MCM-41 type materials (e.g. Beck, J. S. et al. J.Am.Chem.Soc. Vol.114 (1992) 10834), both articles of which are incorporated herein by reference. However, MCM-41 type materials only exhibit a strict two-dimensional order and consequently do not posses the same acidity as zeolites with three-dimensional order.

This invention provides a method for preparing zeolite single crystals with a tuneable pore system of straight mesopores through the individual zeolite crystals.

The invention provides also zeolite single crystals and hence catalytic material with straight mesopores prepared according to the method of the invention.

The invention provides furthermore activated catalytic material comprising zeolite single crystals with straight mesopores that have been subjected to dealumination and/or ion-exchange.

BRIEF DESCRIPTION OF THE DRAWINGS

FIG. 1 is a transmission electron micrograph of a mesoporous zeolite with tortuous pores made in accordance with Example 1 of the present application.

FIG. 2 is a transmission electron micrograph of a carbon nanotube templated mesoporous silicalite-1 after calcination made in accordance with Example 2 of the present application.

FIG. 3 is a transmission electron micrograph of a carbon nanotube templated mesoporous silicalite-1 after calcination made in accordance with Example 4 of the present application.

The method according to the invention involves crystallisation of the zeolite within and on surface of a matrix consisting of particles of which a majority is in the size range of 10–500 nm. In this way it is possible for the zeolite to grow into large single crystals encapsulating part of the matrix particles. The zeolite is impregnated both inside and on the surface of the matrix, if the amount of impregnation solution (zeolite gel) applied is higher than the pore volume characteristic of the matrix (excess of gel compared to incipient wetness).

When using carbon as the matrix, the zeolite crystals can be isolated by removal of the carbon either by controlled combustion or by hydrogenation. Other matrices can be used and removed e.g. by selective dissolution or by hydrolysis etc. In heterogeneous catalysts, such pores are essential to allow unhindered transport of reactants and products to and from the active catalytic sites.

The resulting mesoporous zeolite single crystals contain footprints from the carbon matrix. The carbon matrix dictates the mesopore system and the pore size can be tuned by proper choice of the carbon. Applying carbon black as a mesopore template results typically in intracrystalline mesopores with a high degree of tortuousity.

The mesoporosity of the zeolite crystals can be controlled by adjusting the amount of zeolite gel relative to the amount of the carbon matrix. During crystallisation it is essential that the zeolite gel precursor is located both around and inside the pore system of the matrix. Otherwise, large single crystals are not formed but small isolated crystals can instead be obtained as described in Chem. Comm. (1999), (673).

The matrix is preferably inert and stable under zeolite synthesis conditions and exhibits appropriate pore morphology. By removing the matrix from the large single crystals, mesopores are created inside the individual large crystals, i.e. intracrystalline mesopores.

Large zeolite crystals with intracrystalline mesopores are easily separated from the synthesis medium by means of filtration, whereas micro zeolite crystals (being able to create intercrystalline mesopores) require ultracentrifugation in order to be separated from the synthesis medium. Another advantage of large single zeolite crystals is that the hydrothermal stability of the zeolite is increased.

It is preferred to remove the matrix to an extent, which does not hinder transport of reactants and products in the mesopores. However, complete removal of the matrix is not required. Preferably, the remaining amount of matrix material inside the zeolite crystals is as low as possible.

The inventive method is generally applicable in preparation of mesoporous zeolite single crystals and in the preparation of crystalline material where the material crystallises within and around the pore system of a removable matrix. The matrix can be removed by combustion hydrogenation, selective dissolution and evaporation.

Mesoporous zeolites possess a great potential in diffusion limited processes. Moreover, by tailoring the pore tortuosity, the diffusion limitation would be even less pronounced. The tortuosity factor [J. Karger, D. M. Ruthven, Diffusion in zeolites and other microporous solids, (John Wiley & Sons, New York, (1992), page 342) is expressed as:

$$D = \epsilon_p D_p / \tau, \text{ where}$$

$D$ = Diffusivity
$\epsilon_p$ = Porosity
$D_p$ = Diffusivity for a straight channel of the same diameter
$\tau$ = Tortuosity factor.

Typical tortuosity factors for pores created by agglomeration of primary particles are 3–5, which means the diffusion in an ideal straight channel of similar diameter is 3–5 times faster. This illustrates the benefits of having straight intracrystalline mesopores compared to tortuous mesopores with similar diameter. The active sites available for catalytic reaction are thus more easily accessible in a mesoporous crystal with straight pores, than in a crystal with tortuous pores.

Carbon fibres can be used for producing a pore system of straight channels, and by applying, for example, carbon nanotubes as a mesopore template i.e. crystallise the zeolite around the mesopores, zeolites with intracrystalline mesopore systems with straight channels or pores can be obtained.

A high degree of control over the diameter of carbon nanotubes improves the control of the mesopore characteristics of the resulting zeolite. Carbon nanotubes are potentially cheap templating materials with low concentrations of impurities. Mesopore templating resulting in straight mesopores can be obtained using the following templates:
Single-walled carbon nanotubes
multi-walled carbon nanotubes
carbon whiskers
mixtures of these materials.

Other tubular-shaped materials with diameters between 2 nm and 50 nm and a length-to-diameter aspect ratio greater than 5 can also be used as templates for straight mesopores.

The following examples describe experiments, whereby zeolite single crystals with straight mesopores and thus catalytic materials are synthesised using different templating materials. Examples of post-synthesis modification of the mesoporous zeolites, resulting in activated catalytic materials, are also provided. These modifications are exemplified by dealumination and cation-exchange treatment.

The mesoporous zeolites exemplified are prepared by sequential impregnation of carbon nanotubes or whiskers. The carbon nanotubes have an average diameter of 12 nm, with the multi-walled nanotubes consisting of 6–8 graphene layers. Typically, the nanotubes are several micrometers long. During growth of a zeolite single crystal around the carbon nanotubes, it is essential that nucleation of the zeolite takes place exclusively between the carbon nanotubes. Nucleation between the nanotubes will not occur if the nanotubes are simply dip-coated with a zeolite synthesis gel. The zeolite is therefore synthesised in the void between the nanotubes by sequential impregnation of the individual synthesis gel components.

Dealumination of zeolites is generally obtained by selective removal of $M^{3+}$ elements from the zeolite framework or crystal structure, and it is typically obtained by removal of $Al^{3+}$ ions. The Si to Al ratio in the zeolite is important for its catalytic activity, sorption and ion-exchange capacity, and control of this ratio is therefore essential for a zeolite's catalytic properties. Dealuminizing agents include mineral and polyvalent acids and chelating agents.

Cation-exchange of zeolites is generally obtained by contacting the zeolite with an aqueous solution of the cation-exchange agent, typically an ammonium-containing agent, under conditions sufficient to exchange the cations in the zeolite.

Both dealumination and cation-exchange can be performed simultaneously by the use of aqueous solutions of the above-mentioned agents at mild conditions.

Post-synthesis modification treatment is illustrated using the following methods:
Dealumination Methods:
chelating route using an oxalate compound
Acid dealumination with HCl or $HNO_3$.
Cation-exchange Methods:
Ammonium acetate solution
Ammonium chloride solution.
Combined Methods:
Oxalic acid—Oxalic acid/ammonium oxalate solutions.

Abbreviations of some of the chemical components used are as follows:

| | |
|---|---|
| tetrapropylammonium hydroxide | TPAOH |
| tetraethylorthosilicate | TEOS |
| tetrapropylammonium oxide | $TPA_2O$ |
| ethanol | EtOH |
| tetraethylammonium hydroxide | TEAOH |

Characterisation Methods:

Meso and macropore characterisation before and after dealumination was obtained using Hg-intrusion porosimetry. Crystallinity and crystal morphology was obtained using X-ray powder diffraction (XRPD) and Transmission electron microscopy (TEM), respectively.

Carbon nanotubes (CNT's) were supplied by Hyperion Catalysis International, and carbon black pearls 2000 were supplied by Carbot Corp.

EXAMPLE 1

Comparative Example

Synthesis of mesoporous zeolite having tortuous pores. In a specific embodiment of the invention, 15 g of Carbon Black Pearls 2000 were impregnated to around 30% excess compared to incipient wetness with a clear solution of TPAOH, sodium hydroxide, sodium aluminate (corresponding to approx. 50% zeolite), water and ethanol. After evaporation of ethanol, the carbon particles are impregnated with 18.3 g TEOS, which corresponds to 30% excess of the evaporated ethanol volume. The composition of the synthesis gel on a molar basis, was:

$1Al_2O_3$: $20TPA_2O$: $1Na_2O$: $100SiO_2$: $200H_2O$ $200EtOH$.

After ageing for 3 hours at room-temperature, the impregnated carbon black was introduced into a stainless steel autoclave containing enough water to produce saturated steam and heated to 180° C. for 72 hours. After cooling the autoclave to room-temperature, the product was suspended in water, filtered by suction, resuspended in water and filtered again. This procedure was repeated four times. Finally the product was dried at 1100 for 10 hours. The carbon black matrix was removed by combustion in a muffle furnace at 550° C. for 8 hours. Transmission electron micrographs of the resulting zeolite are shown in FIG. 1.

EXAMPLE 2

Synthesis of Mesoporous Silicalite-1 having Straight Pores 2 g of Carbon nanotubes (pre-dried overnight at 130° C.) in a beaker were impregnated with 4 g of TEOS by dropwise addition. The sample was subsequently placed in a dessicator over a 25 wt % aqueous ammonia solution for 10 hours, allowing TEOS to hydrolyse. Then 1.35 g $H_2O$ was added, and after digestion for 3 hours a premixed clear solution comprising 4.0 g 40 wt % TPAOH, 0.5 g $H_2O$, and 1.0 g EtOH was added dropwise without exceeding the porevolume. The resulting gel had the molar composition:

$20TPA_2O$: $100SiO_2$: $1230H_2O$

The sample was aged for 10 hours at ambient temperature. The sample was then transferred to a porcelain cup in autoclave, which had been charged with sufficient water to create a saturated steam atmosphere at the hydrothermal crystallisation conditions. The autoclave was heated to 175° C. and held at this temperature for 24 hours. The cooled sample was washed with distilled water, filtered on a Büchner filter and dried at 110° C. Subsequently, the matrix was removed by heating (calcining) the sample to 600° C. at 2° C./min., and held at this temperature for 11 hours.

XRPD characterisation verified the presence of a crystalline MFI-type material, and a TEM of the resulting zeolite crystals is shown in FIG. 2. In this figure, the zeolite crystals are recognisable as dark elements with brighter ends and channels upon them. These straight channels, created by matrix removal, reflect the size of the carbon nanotube. Electron diffraction verified that the mesopores were not a result of agglomeration of small crystals, but rather intracrystalline mesopores, i.e. each of the micronsized domains are individual crystals. The individual crystals created in Example 2 were typically of the size $0.5 \times 0.5 \times 0.7$ $\mu m^3$.

EXAMPLE 3

Synthesis of Mesoporous ZSM5 with Straight Pores 2 g of carbon nanotubes (pre-dried overnight at 130° C.) in a beaker was impregnated with 4 g of TEOS by dropwise addition. The sample was subsequently placed in a dessicator over a 25 wt % aqueous ammonia solution for 10 hours, allowing TEOS to hydrolyse. Then 1.35 g $H_2O$ was added, and after digestion for 3 hours a premixed clear solution comprising 4.0 g 40 wt % TPAOH, 0.036 g sodium aluminate (i.e.NaAlO$_2$ consisting of 54 wt % Al$_2$O$_3$ and 41 wt % Na$_2$O), 0.5 g H$_2$O, and 1.0 g EtOH was added dropwise without exceeding the pore-volume. The resulting gel has the molar composition:

1Al$_2$O$_3$: 20TPA$_2$O: 1.25 Na$_2$O: 100 SiO$_2$: 1230H$_2$O

The sample was aged for 10 hours at ambient temperature, and thereafter transferred to a porcelain cup in an autoclave, which had been charged with sufficient water to create a saturated steam atmosphere at the hydrothermal crystallisation conditions. The autoclave was heated to 175° C. and held at this temperature for 72 hours. The cooled sample was washed with distilled water filtered on a Büchner filter and dried at 110° C. Subsequently, the matrix was removed by heating the sample to 600° C. at 2° C./min. and held at this temperature for 11 hours.

The characteristics of this material were similar to the mesoporous silicalite-1 obtained in Example 2, except for the content of framework-incorporated aluminium, known for introducing a capacity for ion-exchange and potential acidity.

EXAMPLE 4

Synthesis of a Mesoporous Beta Zeolite with Straight Pore Channels 2 g of carbon nanotubes predried at 130° C. for 4 hours were impregnated with a clear mixture of 2.6 g TEOS and 0.5 g ethanol as described in Example 2. The sample was aged overnight in a dessicator over a 25 wt % aqueous ammonia solution allowing TEOS to hydrolyse. A premixed clear solution comprising 3.2 g 30 wt % TEAOH and 0.088 g NaAl$_2$O is subsequently added to the sample by impregnation. The final gel composition on a molar basis, was:

1.6Al$_2$O$_3$: 15.7TEA$_2$O: 2.3 Na$_2$O: 50SiO$_2$: 510H$_2$O

After ageing for 3 hours at ambient temperature, the impregnated carbon nanotubes were transferred to a stainless steel autoclave containing sufficient water to produce saturated steam and heated to 140° C. for 5 days. After quenching, the product was re-suspended in water and subsequently filtered by suction. This procedure was repeated four times. Finally, the carbon nanotube matrix was removed by calcination at 600° C. for 11 hours.

FIG. 3 shows a TEM of carbon nanotube templated mesoporous silicalite-1 after calcination. The lattice fringes of the crystalline zeolite observed are extended throughout the crystal, demonstrating that a high crystallinity is achieved, and the mesopores from the carbon nanotubes are observed as bright spots within the zeolite crystals.

EXAMPLE 5

Synthesis of Mesoporous ZSM5 with Straight Pores

Carbon whiskers (solid filamentous carbon with a typical diameter around 20 nm and longer than 5 µm), 2.5 g (pre-dried overnight at 130° C.) in a beaker were impregnated with 4 g of TEOS by dropwise addition. The sample was subsequently placed in a dessicator over a 25 wt % aqueous ammonia solution for 10 hours allowing TEOS to hydrolyse. Then 1.35 g H$_2$O was added and after digestion for 3 hours a premixed clear solution comprising 4.0 g 40 wt % TPAOH, 0.036 g sodium aluminate (i.e. NaAlO$_2$ consisting of 54 wt % Al$_2$O$_3$, and 41 wt % Na$_2$O), 0.5 g H$_2$O, and 1.0 g ethanol (EtOH) was added dropwise without exceeding the porevolume.

The resulting gel had the molar composition:

1Al$_2$O$_3$: 20TPA$_2$O: 1.25Na$_2$O: 100SiO$_2$: 1230H$_2$O.

The sample was aged for 10 hours at ambient temperature and then transferred to a porcelain cup in autoclave, which had been charged with sufficient water to create a saturated steam atmosphere at the hydrothermal crystallisation conditions. The autoclave was heated to 175° C. and held at this temperature for 72 hours. The cooled sample was washed with distilled water, filtered on a Büchner filter and dried at 110° C. Subsequently, the matrix was removed by heating the sample to 600° C. at 2° C./min. and held at this temperature for 11 hours.

The characteristics of this material were similar to the mesoporous ZSM5 obtained in Example 3, except for a different average intracrystalline mesopore morphology, i.e. diameter and connectivity, consistent with the differences of the fibrous templating materials.

EXAMPLE 6

Dealumination of Mesoporous ZSM5 by Oxalic Acid Solution 5 g ZSM5 zeolite from Example 3.

200 ml 2M oxalic acid solution (50.4 g oxalic acid, H$_2$O to 200 ml).

1. The stirred suspension is refluxed for 1 hour at 65° C.
2. Then the suspension is filtered and washed 3 times with distilled water.
3. Dried at 120–150° C. for 4 hours.
4. Calcined at 600° C. for 4 hours in air.

EXAMPLE 7

Dealumination of Mesoporous ZSM5 by Nitric Acid Solution 5 g ZSM5 zeolite from Example 3.

200 ml 2M HNO$_3$ acid solution.

1. The stirred suspension is refluxed for 5 hours at 50° C.
2. Then the suspension is filtered and washed 3 times with distilled water.
3. Dried at 120–150° C. for 4 hours.
4. Calcined at 600° C. for 4 hours in air.

EXAMPLE 8

A. Dealumination of Mesoporous Zeolite Beta by Oxalic Acid Solution 5 g zeolite Beta from Example 4.

200 ml 2M oxalic acid solution (50.4 g oxalic acid, H$_2$O to 200 ml).

1. The stirred suspension is refluxed for 1 hour at 65° C.
2. Then the suspension is filtered and washed 3 times with distilled water.
3. Dried at 120–150° C. for 4 hours.
4. Calcined at 600° C. for 4 hours in air.

B. Simultaneous Dealumination and Cation-exchange of Mesoporous Zeolite Beta by Oxalate Solutions 5 g zeolite Beta from Example 4.

200 ml 2M oxalic acid solution (50.4 g oxalic acid, H$_2$O to 200 ml).

1. The stirred suspension is refluxed for 1 hour at 65° C.

2. Then the suspension is filtered.
3. Then filtered product is re-suspended in a 1M oxalic acid/0.5M ammonium oxalate buffer solution.
4. The stirred suspension is refluxed for 1 hour at 65° C.
5. Then the suspension is filtered and washed 3 times with distilled water.
6. Dried at 120–150° C. for 4 hours.
7. Calcined at 600° C. for 4 hours in air.

EXAMPLE 9

A. Dealumination of Mesoporous Zeolite Beta by Nitric Acid Solution 5 g zeolite Beta from Example 4.
200 ml 2M $HNO_3$ acid solution.
1. The stirred suspension is refluxed for 5 hours at 50° C.
2. Then the suspension is filtered and washed 3 times with distilled water.
3. Dried at 120–150° C. for 4 hours.
4. Calcined at 600° C. for 4 hours in air.

B. Cation-Exchange of Mesoporous Zeolite Beta with Ammonium Acetate Solution 5 g zeolite Beta from Example 4.
200 ml 1M $NH_4CH_3COO$ solution.
5. The stirred suspension is refluxed for 5 hours at 50° C.
6. Then the suspension is filtered and washed 3 times with distilled water.
7. Dried at 120–150° C. for 4 hours.
8. Calcined at 600° C. for 4 hours in air.

The Si/Al ratios and percentage aluminium obtained from chemical analysis in mesoporous ZSM-5 and mesoporous Zeolite Beta before and after the dealumination tests above are given in Table 1 below.

TABLE 1

Ai/Al ratio and percentage aluminium before and after dealumination.

| Zeolite | Zsm-5 | Beta |
| --- | --- | --- |
| Parent | 41 (1.008%) | 14 (2.855%) |
| Dealuminated with $HNO_3$ | 66 (0.676%) | 45 (0.975%) |
| Dealuminated with Oxalic acid | 68 (0.646%) | 53 (0.826%) |

The results of the dealumination and pore volume experiments show that the morphology and the crystallinity of mesoporous zeolites with straight pores are maintained despite post-synthesis modification including carbon nanotube matrix removal, dealumination and ion-exchange of the zeolite.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. Method of preparing zeolite single crystals with straight mesopores by applying a synthesis gel with zeolite precursor composition within the pore system and on the surface of a particulate matrix material template of carbon comprising the steps of:

providing a templating material with a diameter of 2 to 50 nanometers and a length-to-diameter aspect ratio of at least 5, applying the zeolite precursor to the surface of the templating material using sequential impregnation, subjecting the precursor composition to crystallising conditions, and isolating porous single zeolite crystals with straight mesopores by removing the matrix template material.

2. The method of claim 1, wherein the templating material consists of carbon nanotubes.

3. The method of claim 1, wherein the template matrix material is removed from the zeolite crystals by combustion, hydrogenation, selective dissolution and/or evaporation.

4. Zeolite single crystals with straight mesopores prepared according to the method of claim 1.

5. Catalytic material comprising zeolite single crystals with straight mesopores prepared according to the method of claims 1.

6. Activated catalytic material comprising zeolite single crystals with straight mesopores prepared according to the method of claim 1, wherein the zeolite single crystals are subjected to dealumination.

7. Activated catalytic material comprising zeolite single crystals with straight mesopores prepared according to the method of claim 1, wherein the zeolite single crystals are subjected to ion-exchange.

* * * * *